United States Patent [19]

Ishikawa et al.

[11] Patent Number: 5,751,050
[45] Date of Patent: May 12, 1998

[54] SEMICONDUCTOR DEVICE HAVING A POLYSILICON RESISTOR ELEMENT WITH INCREASED STABILITY AND METHOD OF FABRICATING SAME

[75] Inventors: Hiraku Ishikawa; Tatsuya Usami, both of Tokyo, Japan

[73] Assignee: NEC Corporation, Tokyo, Japan

[21] Appl. No.: 736,506

[22] Filed: Oct. 24, 1996

[30] Foreign Application Priority Data

Oct. 25, 1995 [JP] Japan ................................. 7-302125

[51] Int. Cl.$^6$ ................................................ H01L 31/0368
[52] U.S. Cl. .......................... 257/538; 257/536; 257/380
[58] Field of Search .................................. 257/379, 380, 257/536, 537, 538

[56] References Cited

U.S. PATENT DOCUMENTS

| | | | |
|---|---|---|---|
| 4,579,600 | 4/1986 | Shah et al. | 29/576 B |
| 4,602,421 | 7/1986 | Lee et al. | 29/576 B |
| 4,828,629 | 5/1989 | Ikeda et al. | 257/538 |
| 5,087,956 | 2/1992 | Ikeda et al. | 257/380 |

FOREIGN PATENT DOCUMENTS

| | | |
|---|---|---|
| 5-16186 | 3/1993 | Japan . |
| 5-56661 | 8/1993 | Japan . |
| 6-91189 | 11/1994 | Japan . |

OTHER PUBLICATIONS

Hideki Shibta et al, "Time Dependent Resistance Increase in Poly-Si Load Resistor due to Hydrogen Diffusion from Plasma-Enhanced Chemical Vapor Deposition Silicon Nitride Film in High Density Static Random Access Memories", Jpn. J. Appl. Phys. vol. 33 (1994) pp. 1298-1304, Part 1, No. 3A, Mar. 1994.

*Primary Examiner*—Tom Thomas
*Assistant Examiner*—David B. Hardy
*Attorney, Agent, or Firm*—Sughrue, Mion, Zinn, Macpeak & Seas, PLLC

[57] ABSTRACT

A base insulator film comprised of a silicon oxide film or the like is formed on the surface of a silicon substrate, and a non-doped polysilicon film (resistor layer) is selectively formed on the base insulator film by thermal CVD. A first silicon oxide film and a BPSG film are sequentially formed on the entire surfaces of the base insulator film and the polysilicon film. Then, two openings which reach the polysilicon film are formed in the BPSG film and the first silicon oxide film, and an impurity is selectively doped into the surface of the polysilicon film through those openings. As a result, a high-resistance section is formed in the polysilicon film between the two openings. Then, the openings are filled with metal layers, and then metal wires to be connected to the metal layers are formed on the surface of the BPSG film. Then, a second silicon oxide film is formed on the entire surfaces of the BPSG film and the metal wires by bias ECR (Electron Cyclotron Resonance)—CVD having a high electric field to coat the metal wires and the like. The high electric field ECR-CVD deposition increases the hydrogen atomic concentration of the polysilicon resistor layer so as to stabilize the resistance against diffusion of lower atomic concentrations of incidental hydrogen atoms from various other interlayer insulating layers.

14 Claims, 6 Drawing Sheets

5,751,050

SEMICONDUCTOR DEVICE HAVING A POLYSILICON RESISTOR ELEMENT WITH INCREASED STABILITY AND METHOD OF FABRICATING SAME

BACKGROUND OF THE INVENTION

1. Field of the Invention

The present invention relates to a semiconductor device having a resistor element made of polysilicon, and, more particularly, to a semiconductor device whose resistor element has a stable resistance.

2. Description of the Related Art

Recently, the integration and packing density of semiconductor devices become higher and higher. To match such a demand, there has been a proposal to form resistor elements of polysilicon, which are constituents of a semiconductor integrated circuit device; e.g., a static RAM (SRAM) whose load resistor elements are formed of polysilicon has been proposed. First, a polysilicon film is formed in a predetermined pattern on an insulator film formed on a polysilicon substrate. Next, an impurity is doped into this polysilicon film as needed to set the desired resistance, and then an interlayer insulator film or a passivation film is formed on this polysilicon film. Then, a through hole is formed in the interlayer insulator film to form a contact to be electrically connected to the polysilicon film. As a result, a resistor element is formed.

When polysilicon is used for a resistor element, hydrogen atoms and impurity or the like contained in the interlayer insulator film or the passivation film are diffused into the polysilicon film, varying the resistance. A resistor element which can prevent a variation in resistance caused by such impurity diffusion is disclosed in Examined Japanese Patent Publication No. Hei 5-16186. This structure is hereinafter referred to as "first prior art."

FIGS. 1A through 1C are cross-sectional views illustrating the step-by-step fabrication of an SRAM according to the first prior art. As shown in FIG. 1A, a field $SiO_2$ film 22 and a gate $SiO_2$ film 23 are selectively formed on a p type Si single crystalline substrate 21. Polycrystalline Si layers 24 are respectively formed on the field $SiO_2$ film 22 and the gate $SiO_2$ film 23. Then, a thermal oxide $SiO_2$ film 25 and an $Si_3N_4$ layer 26 are sequentially formed on the entire surface of the resultant structure. Next, a CVD $SiO_2$ film 27 is formed on the $Si_3N_4$ layer 26 on the field $SiO_2$ film 22 by patterning, and then phosphorus ions are injected to form an $N^+$ diffusion layer 28 on the surface of the substrate 21 between the field $SiO_2$ film 22 and the gate $SiO_2$ film 23. At the same time, phosphorus ions are injected into the polycrystalline Si layer 24 to form a high-resistance section 29 doped with no phosphorus ions directly under the CVD $SiO_2$ film 27.

Then, the thermal oxide $SiO_2$ film 25 and the $Si_3N_4$ layer 26 are etched out excluding a thermal oxide $SiO_2$ film 25a and an $Si_3N_4$ layer 26a on the high-resistance section 29, and a new thermal oxide $SiO_2$ film 30 is formed on the resultant structure, as shown in FIG. 1B.

Then, a PSG film 31 is formed on the entire surface of the resultant structure, contact holes are selectively formed in this PSG film 31 to expose the surfaces of the $N^+$ diffusion layer 28 and the polycrystalline Si layer 24, and Al wires 32 which are to be electrically connected to those layers 28 and 24 are formed, as shown in FIG. 1C.

In the thus constituted SRAM, the thermal oxide $SiO_2$ film 25a, the $Si_3N_4$ layer 26a and the CVD $SiO_2$ film 27 are formed on the high-resistance section 29 in the polycrystalline Si layer 24. It is therefore possible to prevent the impurity contained in the PSG film 31 formed on those layers from being diffused into the high-resistance section 29 in the polycrystalline Si layer 24 and prevent the resistance from varying due to the impurity diffusion.

According to the first prior art, however, it is difficult to prevent hydrogen atoms from being diffused into the high-resistance section 29.

Semiconductor devices designed to be able to prevent the diffusion of hydrogen atoms into the resistor element are disclosed in Examined Japanese Patent Publication No. Hei 5-56661 and Hei 6-91189. Those semiconductor devices are hereinafter referred to as "second prior art" and "third prior art." Besides those prior arts, a scheme of preventing the diffusion of hydrogen atoms has been reported (Sibata et al., Jpn. J. Appl. Phys. Vol. 33 Part 1, No. 3A, March 1994, pp. 1298–1304).

FIG. 2 is a cross-sectional view showing the structure of the semiconductor device according to the second prior art. A first silicon oxide film 42 is formed on a silicon substrate 41, and a polycrystalline Si film 43 is selectively formed on this first silicon oxide film 42. A second silicon oxide film 44 is formed on the surface of the polycrystalline Si film 43, and a silicon nitride film 45 is formed on the entire surfaces of the first and second silicon oxide films 42 and 44.

As the second silicon oxide film 44 and the silicon nitride film 45 are formed on the surface of the polycrystalline Si film 43 in the thus constituted semiconductor device according to the second prior art, hydrogen atoms from the film (not shown) formed on the surfaces of those films 44 and 45 can be prevented from being diffused into the polycrystalline Si layer 43.

FIG. 3 is a cross-sectional view showing the structure of the semiconductor device according to the third prior art. A device-isolating oxide film 52 and a gate oxide film 53 are formed on a p type silicon substrate 51, a gate electrode 54 of polysilicon is selectively formed on the gate oxide film 53. An n type source-drain region 55 is formed on the surface of the p type silicon substrate 51 excluding the gate electrode 54 and the device-isolating oxide film 52. Then, a silicon oxide film 56, a BPSG film 57 and a first silicon nitride film 58 are sequentially formed on the entire surface of the resultant structure, and a high-resistance layer 59 of polysilicon is selectively formed on the first silicon nitride film 58.

Further, a second silicon nitride film 60 and an interlayer insulator film 61 are formed on the entire surface of the resultant structure. Then, contact holes reaching the p type silicon substrate 51 from the interlayer insulator film 61 are formed, and wires 62 of aluminum are formed inside those contact holes. A passivation film 63 is then formed on the entire surface of the resultant structure.

Since the first and second silicon nitride films 58 and 60 cover the top and bottom surfaces of the high-resistance layer 59 of polysilicon in the thus constituted semiconductor device according to the third prior art, the diffusion of hydrogen atoms into the high-resistance layer 59 can be prevented.

According to the prior arts, as described above, the top surface or the top and bottom surfaces of the polycrystalline Si film 43 or the high-resistance layer 59 are covered with the silicon nitride film which has a property to shield hydrogen atoms. Therefore, the diffusion of hydrogen atoms into the polycrystalline Si film 43 or the high-resistance layer 59 is prevented to thereby stabilize the resistance.

The formation of a silicon nitride film however generally requires a treatment at a high temperature of 700° C. or higher for a relatively long period of time, which may cause defects in the fabricated semiconductor device. Normally, an impurity is locally doped into the resistor layer to ohmically connect the contact for electric connection to a polycrystalline Si layer or the like. But, this impurity is diffused into the resistor region of the polycrystalline Si layer in the high-temperature treatment for forming a silicon nitride film, so that the resistance varies.

The long treatment at 700° C. or higher causes the impurity in the source-drain diffusion region in the transistor fabricated in the previous step to be diffused again, thus deteriorating the transistor characteristics.

SUMMARY OF THE INVENTION

Accordingly, it is an object of the present invention to provide a semiconductor device having a resistor element of polysilicon, which can prevent the resistance of the resistor element from varying due to the diffusion of an impurity and hydrogen atoms in the resistor layer, thereby stabilizing the resistance, and a method of fabricating the same.

A semiconductor device having a resistor element according to this invention has a substrate, a resistor layer formed on the substrate and a first interlayer insulator film formed on the resistor layer. This resistor layer is formed of polysilicon, and the first interlayer insulator film is comprised of a silicon oxide film formed by chemical vapor deposition which applies a high-frequency electric field.

It is preferable that the hydrogen atomic concentration in the resistor layer be equal to or greater than $6 \times 10^{18}/cm^3$. The chemical vapor deposition for applying the high-frequency electric field may be bias ECR (Electron Cyclotron Resonance)—CVD.

A second interlayer insulator film may be formed between the resistor layer and the first interlayer insulator film, and the second interlayer insulator film can be comprised of one or both of a silicon oxide film and a BPSG film, formed by atmospheric pressure chemical vapor deposition. It is also preferable that the resistor layer be formed of non-doped polysilicon which is not doped with an impurity.

A method of fabricating a semiconductor device having a resistor element according to this invention has a first step of forming a polysilicon film on a substrate, a second step of patterning the polysilicon film to a predetermined pattern to a resistor layer and a third step of forming a first interlayer insulator film comprised of a silicon oxide film on the resistor layer by chemical vapor deposition for applying a high-frequency electric field.

The first interlayer insulator film may be formed by bias ECR (Electron Cyclotron Resonance)—CVD. A fourth step of forming a second interlayer insulator film may be provided between the second step and the third step. Further, it is preferable that the second step should pattern the polysilicon film with such a thickness and a shape so as to have a predetermined resistance, while the resistor layer has a predetermined hydrogen atomic concentration. Moreover, the predetermined hydrogen atomic concentration can be a hydrogen atomic concentration in the resister layer after formation of the first interlayer insulator film.

According to this invention, at the time the first interlayer insulator film is formed by chemical vapor deposition which applies a high-frequency electric field, hydrogen atoms are introduced into the resistor layer, so that the concentration of the hydrogen atoms in the resistor layer can be increased. Even if hydrogen atoms are diffused into the resistor layer from the second interlayer insulator film or the like after the formation of the first interlayer insulator film, the amount of the diffused hydrogen atoms is considerably smaller than the hydrogen atomic concentration in the resistor layer. The amount of a change in the hydrogen atomic concentration in the resistor layer therefore becomes significantly small. Accordingly, the amount of a change in the resistance of the resistor layer becomes smaller so that the formed resistor layer can show a stable resistance. Because a nitride film or the like for preventing the diffusion of hydrogen atoms need not be formed, it is possible to prevent the transistor characteristics from being degraded by the heat treatment which is otherwise required to form the nitride film.

If this resistor layer is made of non-doped polysilicon, a variation in resistance can further be suppressed.

DETAILED DESCRIPTION OF THE PREFERRED EMBODIMENTS

Figure 4A:
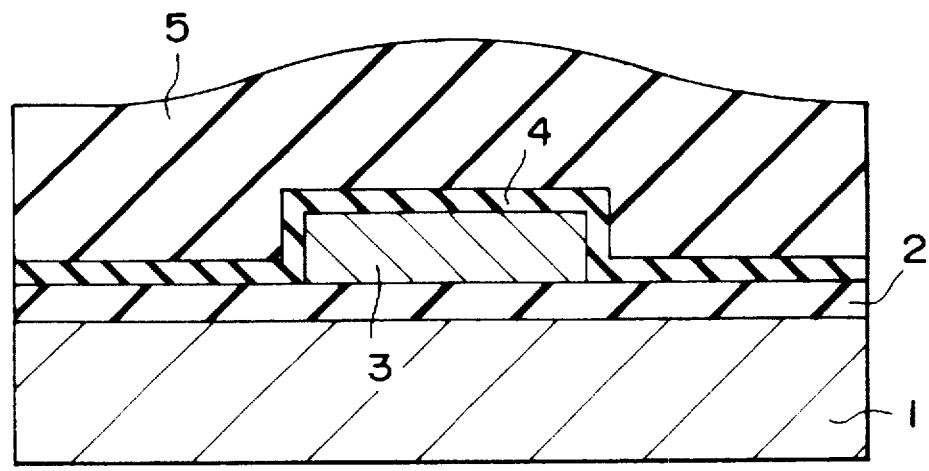
FIGS. 4A and 4B showing sectional views illustrating the step-by-step fabrication of a semiconductor device having a resistor element according to one embodiment of this invention.
Figure 4B:
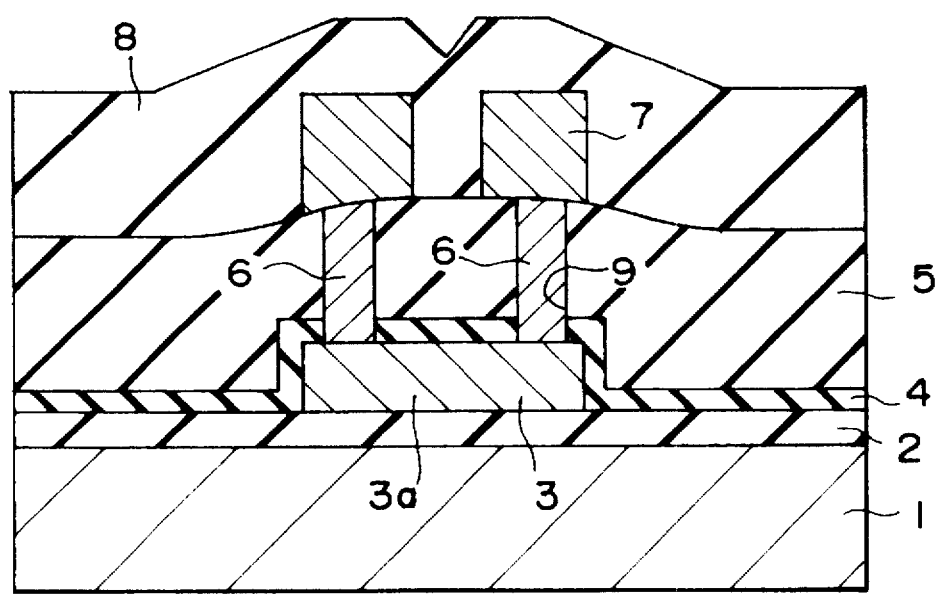

A preferred embodiment of the present invention will now be described with reference to the accompanying drawings. FIGS. 4A and 4B are cross-sectional views illustrating the step-by-step fabrication of a semiconductor device having a resistor element according to one embodiment of this invention.

As shown in FIG. 4A, first, a base insulator film 2 comprised of a silicon oxide film or the like is formed on the surface of a silicon substrate 1, and a non-doped polysilicon film (resistor layer) 3 which has no impurity doped is formed on the base insulator film by thermal CVD. Then, a desired resistor pattern is formed on the polysilicon film 3 by local etching. Next, a first silicon oxide film 4 and a BPSG film 5 (second interlayer insulator film) are sequentially formed on the entire surfaces of the base insulator film 2 and the polysilicon film 3 by atmospheric pressure CVD.

As shown in FIG. 4B, then, two openings 9 which reach the polysilicon film 3 are formed in the BPSG film 5 and the first silicon oxide film 4 above the polysilicon film 3, and an impurity like phosphorus is selectively doped into the surface of the polysilicon film 3 through those openings 9. As a result, a high-resistance section 3a is formed in the polysilicon film 3 between the two openings 9. Then, the metal layers 6 of tungsten or the like are formed in the openings 9 to form ohmic contact with the polysilicon film 3. The metal layers 6 may be formed only in the openings 9 by coating a metal film on the BPSG film 5 with a sufficient thickness to fill tungsten or the like into the openings 9, and then performing anisotropic etching.

Thereafter, a wiring metal film is formed on the entire surface of the BPSG film 5 and is then patterned into the desired wiring pattern to form metal wires 7 to be connected to the metal layers 6. Then, a second silicon oxide film (first interlayer insulator film) 8 is formed on the entire surfaces of the BPSG film 5 and the metal wires 7 by bias ECR (Electron Cyclotron Resonance)—CVD, one of plasma CVD methods which apply a high-frequency electric field, to thereby coat the metal wires 7, etc. Through the above process, the semiconductor device according to the embodiment of this invention is fabricated.

Figure 5:
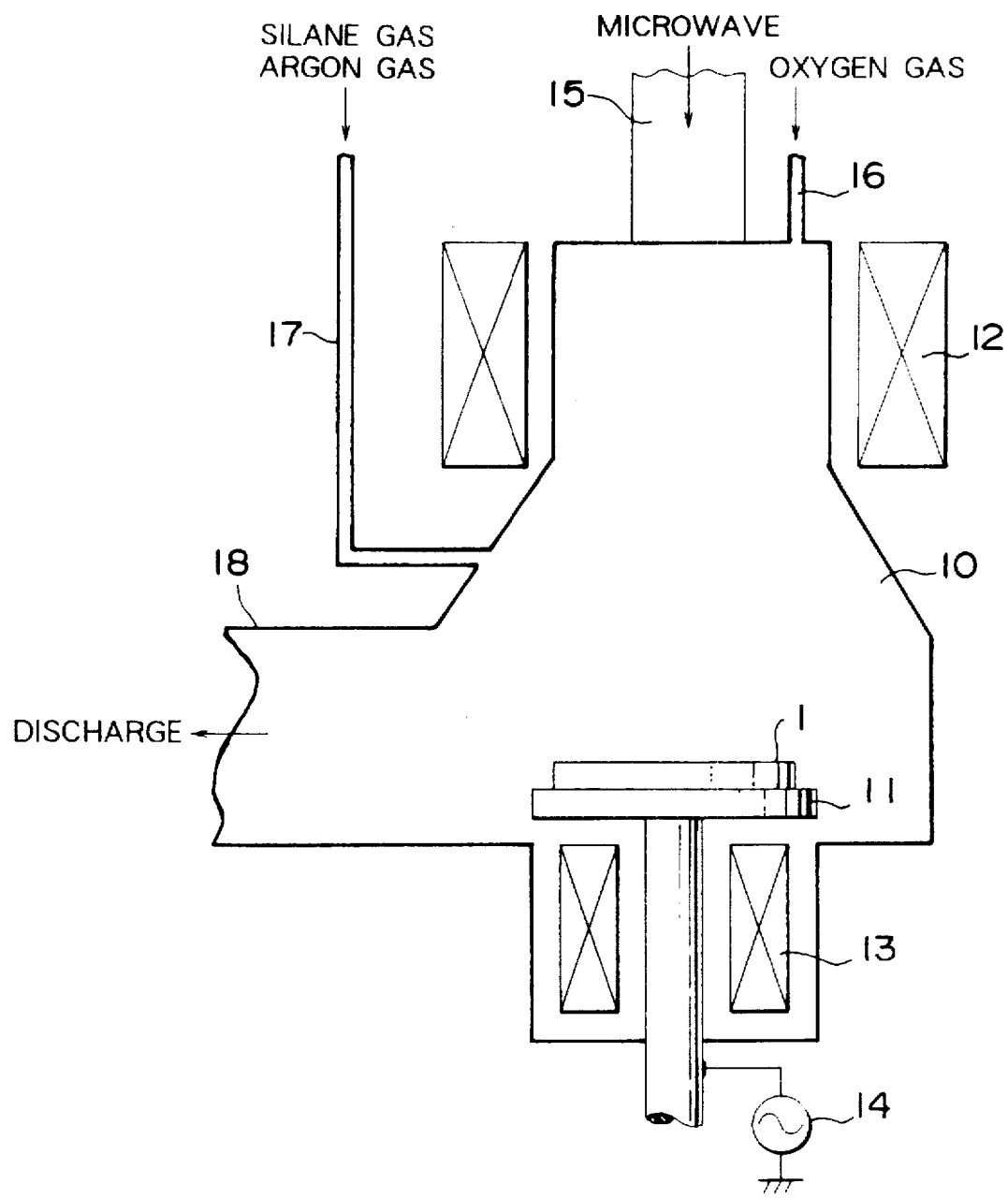
FIG. 5 is an exemplary diagram depicting a bias ECR-CVD apparatus.

The bias ECR-CVD will be discussed below. FIG. 5 is an exemplary diagram depicting a bias ECR-CVD apparatus. A susceptor 11 is set in a chamber 10 and the substrate 1 is placed on the susceptor 11. This susceptor 11 is connected to a high-frequency source 14 outside of the chamber 10. The chamber 10 has a microwave inlet port 15 through which microwaves are supplied inside the chamber 10 from above the position of the substrate 1, an oxygen inlet port 16 for introducing oxygen gas, a gas inlet port 18 for supplying silane gas and argon gas into the chamber 10, and an exit port 18 for discharging gas or the like outside from the chamber 10. A main coil 12 for adjusting the temperature inside the chamber 10 is arranged outside the chamber 10, and an auxiliary coil 13 for temperature adjustment is placed in the chamber 10.

To form the second silicon oxide film 8 using the thus constituted bias ECR-CVD apparatus, first, the substrate 1 formed with the metal wires 7 and the like is placed on the susceptor 11, oxygen gas is supplied into the chamber 10 through the oxygen inlet port 16 and microwaves are applied through the microwave inlet port 15. Consequently, plasma is produced in the chamber 10. When silane gas is supplied into the chamber 10 through the gas inlet port 18, the silane gas and plasma cause the second silicon oxide film 8 to be formed on the substrate 1 on which the BPSG film 5, the metal wires 7 and so forth are formed.

At the same time, argon gas is supplied into the chamber 10 from the gas inlet port 17 and a high-frequency bias is applied to the susceptor 11 by the high-frequency source 14 to etch off the corners or the like of the second silicon oxide film 8 which is grown on the substrate 1. The use of the bias ECR-CVD can therefore form the second silicon oxide film 8 which has a relatively flat surface.

The conditions for forming the second silicon oxide film 8 in this embodiment are, for example, the flow rate of silane gas of 30 sccm, the flow rate of oxygen gas of 45 sccm, the flow rate of argon gas of 70 sccm, the microwave power of 2000 W, the high-frequency bias power of 1400 W and the growth temperature of 350° C.

Since an impurity is doped into the polysilicon film 3 through the openings 9, which reaches the polysilicon film 3, in the thus constituted semiconductor device according to this embodiment, the area between those openings 9 become non-doped and can form the high-resistance section 3a. As the second silicon oxide film 8 is formed above the polysilicon film 3 by the bias ECR-CVD, the concentration of hydrogen atoms in the polysilicon film 3 become higher than the normal one.

Figure 6:
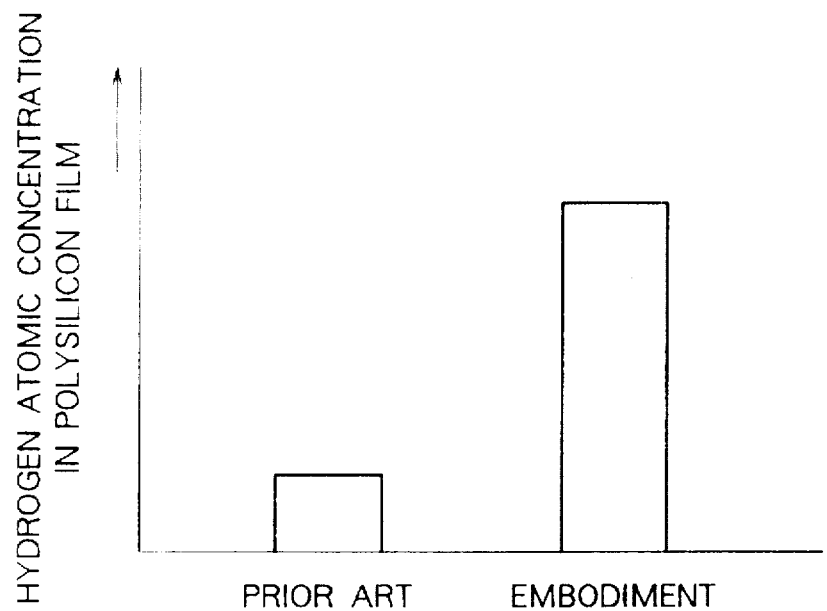
FIG. 6 is a graph showing a hydrogen atomic concentration in a polysilicon film in the semiconductor device of this embodiment in comparison with that in the conventional semiconductor device.

FIG. 6 is a graph showing a hydrogen atomic concentration in a polysilicon film in the semiconductor device of this embodiment in comparison with that in the conventional semiconductor device. The hydrogen atomic concentration in the polysilicon film in the prior art was measured with respect to the semiconductor device which has the silicon oxide film formed above the polysilicon film by the ordinary CVD scheme, whereas the hydrogen atomic concentration in the polysilicon film in this embodiment was measured with respect to the semiconductor device which has the silicon oxide film formed above the polysilicon film by the bias ECR-CVD.

As shown in FIG. 6, the hydrogen atomic concentration in the polysilicon film in this embodiment is $6 \times 10^{18}/cm^3$, which is significantly higher than the hydrogen atomic concentration in the polysilicon film in the prior art. This is because at the time the second silicon oxide film 8 is formed, silane gas is decomposed by the ECR plasma, generating active hydrogen ions. The hydrogen ions are accelerated by the high electric field produced by the high-frequency bias which is applied to the silicon substrate 1, and pass through the BPSG film 5 and the first silicon oxide film 4 to reach the polysilicon film 3, thus increasing the hydrogen atomic concentration in this polysilicon film 3.

As the polysilicon film 3 develops hydrogen atoms with a very high concentration at the time the second silicon oxide film 8 is formed, the resistance of the polysilicon film 3 is what is influenced by the high-concentrate hydrogen atoms. Even when the hydrogen atoms contained in the interlayer insulator film or passivation film, which is formed before or after the polysilicon film 3, are diffused into the polysilicon film 3, the polysilicon film 3 is less affected by the diffused hydrogen atoms. It is therefore possible to suppress a variation in the resistance of the polysilicon film 3. Since the first silicon oxide film 4 is formed on the surface of the polysilicon film 3 by atmospheric pressure CVD, it is possible to prevent the diffusion of phosphorus or boron into the polysilicon film 3 from the BPSG film 5.

Figure 1A:
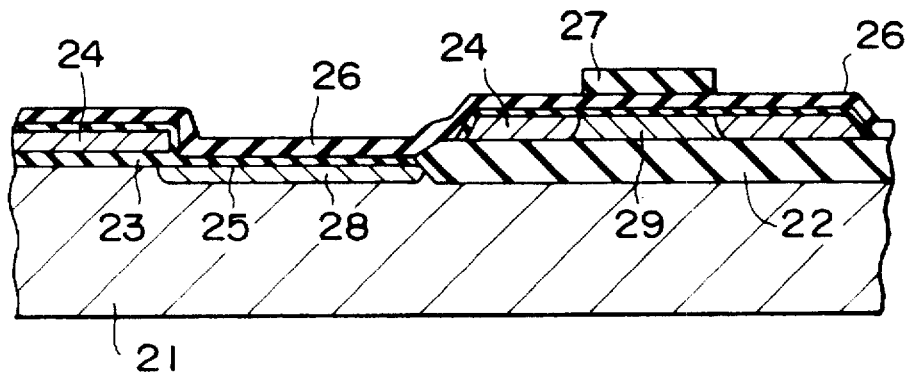
FIGS. 1A through 1C are cross-sectional views illustrating the step-by-step fabrication of an SRAM according to the first prior art.
Figure 1B:
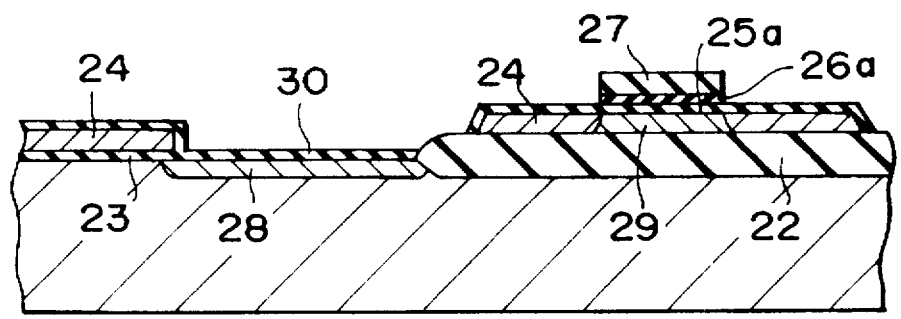
Figure 1C:
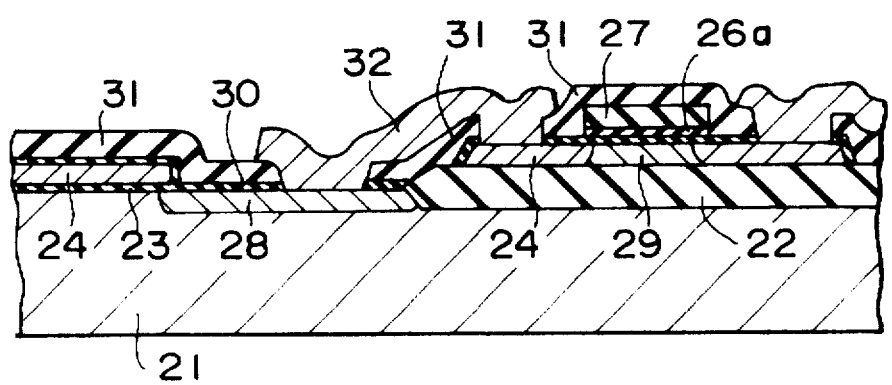
Figure 2:
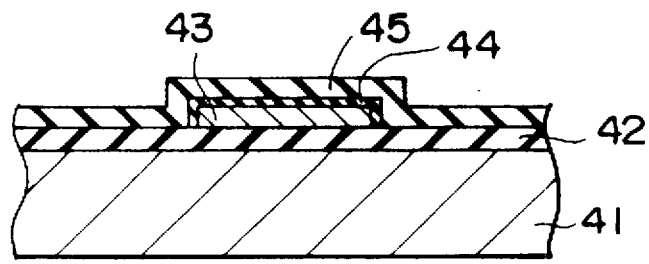
FIG. 2 cross-sectional view showing the structure of a semiconductor device according to the second prior art.
Figure 3:
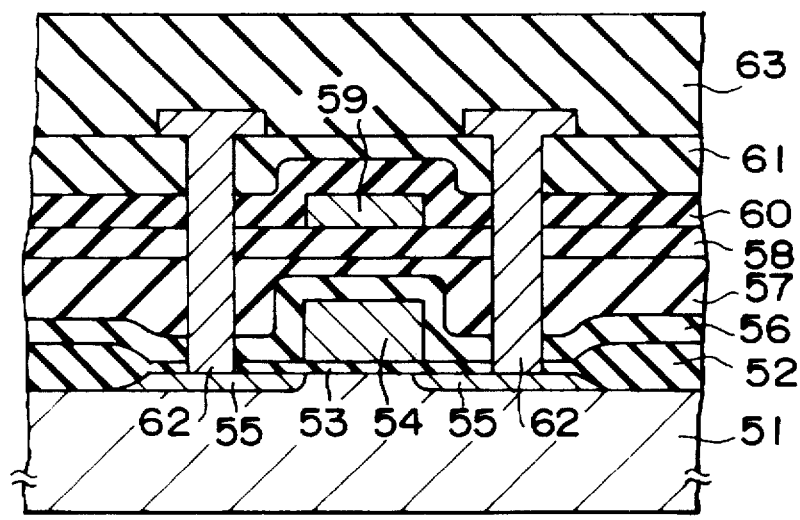
FIG. 3 a cross-sectional view showing the structure of a semiconductor device according to the third prior art.

In fabricating the semiconductor device shown in FIG. 1, therefore, the thickness and the pattern size of the polysilicon film 3 should previously be set to ensure a predetermined high resistance in consideration of the concentration of the hydrogen atom content. After the polysilicon film 3 is formed in this manner, it is effective at preventing a variation in the resistance of the polysilicon film 3 due to the diffusion of hydrogen atoms or the like so that the polysilicon film 3 can a stable high resistance.

Figure 7:
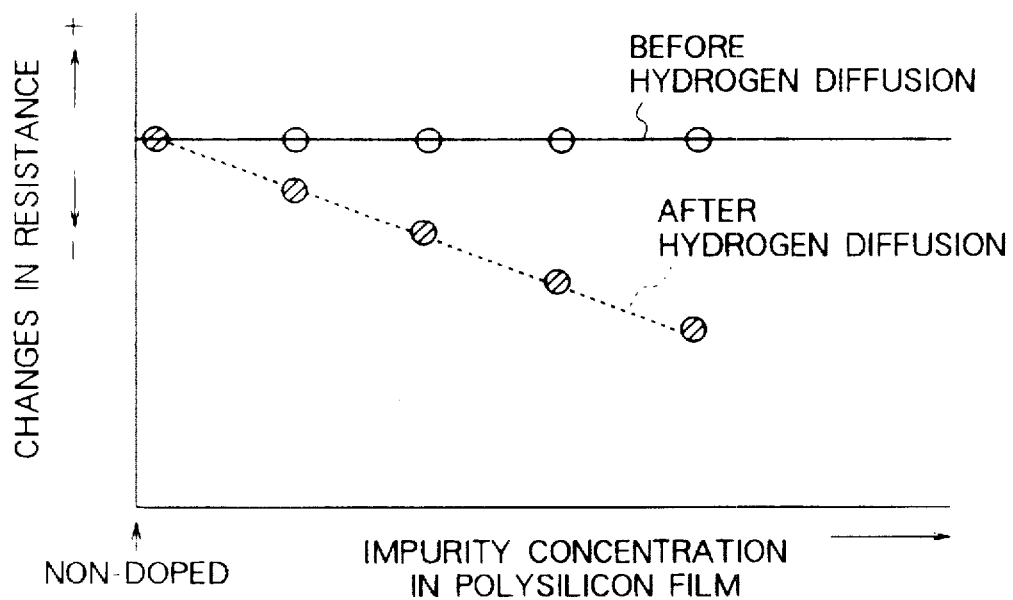
FIG. 7 is a graph showing changes in resistance before and after diffusion of hydrogen atoms, plotting the resistance on the vertical scale and the impurity concentration in the polysilicon film on the horizontal scale.

Although the polysilicon film 3 is formed of non-doped polysilicon in this embodiment as shown in FIG. 4, this invention can also be adapted to the case where the polysilicon film 3 is formed of impurity-doped polysilicon and the high-resistance section 3a is formed in this polysilicon film 3. It is however to be noted that the amount of a change in resistance of polysilicon film by the diffusion of hydrogen atoms varies in accordance with the concentration of the impurity in the polysilicon film 3. FIG. 7 is a graph showing changes in resistance before and after diffusion of hydrogen atoms, plotting the resistance on the vertical scale and the impurity concentration in the polysilicon film on the horizontal scale. As shown in FIG. 7, changes in resistance before and after diffusion of hydrogen atoms are very close to 0 when the polysilicon film is non-doped, while when the impurity concentration in the polysilicon film increases, the resistance after hydrogen diffusion decreases so that the amount of a change in resistance between the resistance before hydrogen diffusion and the resistance after hydrogen diffusion increases. According to this invention, therefore, it is preferable that the polysilicon film 3 be formed on non-doped polysilicon to stabilize the resistance of the high-resistance section 3a of the polysilicon film 3.

In this embodiment, the second silicon oxide film 8 is formed after the first silicon oxide film 4 and the BPSG film 5 are sequentially formed on the polysilicon film 3 by atmospheric pressure CVD, and the hydrogen atomic concentration in the polysilicon film 3 is $6 \times 10^{18}/cm^3$ as mentioned above. If the second silicon oxide film 8 is formed on the first silicon oxide film 4 without forming the BPSG film 5, the hydrogen atomic concentration in the polysilicon film 3 becomes $8 \times 10^{18}/cm^3$, higher than that in the case where the BPSG film 5 is formed. If the second silicon oxide film 8 is formed on the polysilicon film 3 without forming the first silicon oxide film 4 and the BPSG film 5, the hydrogen atomic concentration in the polysilicon film 3 becomes $1.0 \times 10^{19}/cm^3$. This is because that since the BPSG film 5 and/or the first silicon oxide film 4 is not formed between the polysilicon film 3 and the second silicon oxide film 8, the amount of hydrogen atoms introduced into the polysilicon film 3 has increased when the second silicon oxide film 8 is formed by the bias ECR-CVD.

As apparent from the above, it is possible to further increase the hydrogen atomic concentration in the polysilicon film 3 in the semiconductor device which has no BPSG film 5 formed, and it is possible to make the hydrogen atomic concentration in the polysilicon film 3 even higher in the semiconductor device in which the BPSG film 5 and the first silicon oxide film 4 are not formed. This feature can further reduce the influence of the diffusion of hydrogen atoms into the polysilicon film 3 from the passivation film or the like on the resistance of the polysilicon film 3. A change in the resistance of the polysilicon film 3 can be suppressed further to stabilize the resistance. Therefore, it is desirable not to form a BPSG film in the semiconductor device which requires no BPSG film as an interlayer insulator film, and it is desirable not to form the BPSG film and first silicon oxide film in the semiconductor device which requires neither film.

Figure 8:
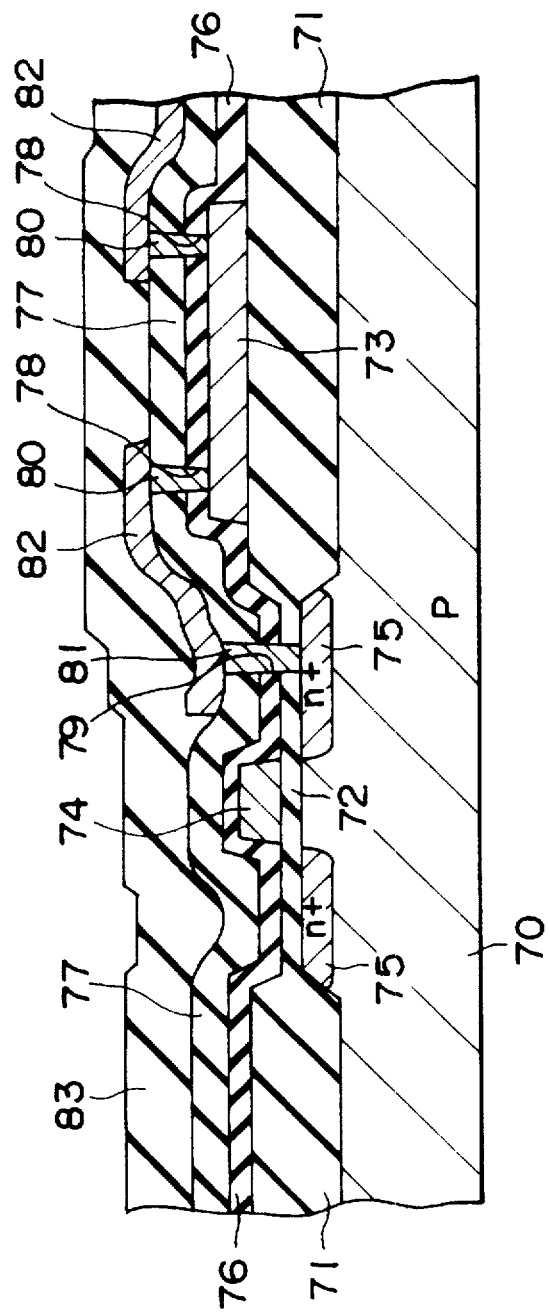
FIG. 8 is a coss-sectional view illustrating the structure of an SRAM to which this embodiment is adapted.

FIG. 8 is a cross-sectional view illustrating the structure of an SRAM to which this embodiment is adapted. As shown in FIG. 8, a field oxide film 71 and a gate oxide film 72 surrounded by the oxide film 71 are formed at the desired positions on a p type silicon substrate 70. Then, a polysilicon film is formed on the surface of the resultant structure and is patterned into a predetermined pattern to form a gate electrode 74 on the gate oxide film 72 and form a resistor layer 73 on the field oxide film 71. Next, an impurity is doped only in the gate electrode 74 comprised of a polysilicon film, and not in the resistor layer 73 also comprised of a polysilicon film, to reduce the resistance of the gate electrode 74. Then, an n type impurity is doped into the surface of the area of the silicon substrate 1, where the gate electrode 74 and the field oxide film 71 are not formed, by self-alignment using the gate electrode 74, thereby forming a source-drain region 75. Then, a first silicon oxide film 76 and a BPSG film 77 as a second interlayer insulator film are sequentially formed on the entire surface of the resultant structure by atmospheric pressure CVD.

Next, two first contact holes 78 which reach the resistor layer 73 are formed in the first silicon oxide film 76 and the BPSG film 77 on the resistor layer 73, and a second contact hole 79 is formed through the gate oxide film 72, the first silicon oxide film 76 and the BPSG film 77 on the source-drain region 75. After an impurity is introduced into the resistor layer 73 through the first contact holes 78, the contact holes 78 and 79 are filled with metal like tungsten to respectively form first metal layers 80 and a second metal layer 81. As a result, the first metal layers 80 have ohmic contact with the resistor layer 73.

Thereafter, aluminum wires 82 are selectively formed on the BPSG film 77 to connect the first metal layers 80 to the second metal layer 81, thereby allowing the transistor to be electrically connected to the resistor layer 73. Then, a second silicon oxide film (first interlayer insulator film) 83 is formed on the entire surface of the resultant structure by bias ECR-CVD to cover the BPSG film 77 and the aluminum wires 82.

As hydrogen atoms are introduced into the resistor layer 73 at the time the second silicon oxide film 83 is formed by bias ECR-CVD in the thus constituted SRAM as in the semiconductor device illustrated in FIG. 4, the hydrogen atomic concentration in the resistor layer 73 increases. That is, even if hydrogen atoms are diffused into the resistor layer 73 from the interlayer insulator film or the like after the formation of the second silicon oxide film 83, the amount of the diffused hydrogen atoms is considerably smaller than the hydrogen atomic concentration in the resistor layer 73, so that a change in the hydrogen atomic concentration in the resistor layer 73 becomes significantly small. Accordingly, there is a little change in the resistance of the resistor layer 73 so that the resistor layer 73 can show a stable resistance. Eventually, it is possible to acquire an SRAM which can retain stored data and can ensure data reading at high precision.

Although this invention is adapted to an SRAM in this embodiment, this invention is in no way limited to this device, but may be adapted to various other types of semiconductor integrated circuits as long as they use a semiconductor device having a resistor layer made of polysilicon.

What is claimed is:

1. A semiconductor device having a resistor element comprising:

a substrate;

a resistor layer formed of polysilicon on said substrate; and a first interlayer insulator film formed on said resistor layer, said first interlayer insulator film being comprised of a silicon oxide film formed by chemical vapor deposition which applies a high-frequency electric field so that hydrogen atomic concentration of said resistor layer is increased to be equal to or greater than $6 \times 10^{18}/cm^3$ and the resistance of said resistor layer is stabilized against diffusion of lower concentrations of incidental hydrogen atoms.

2. The semiconductor device according to claim 1, wherein said chemical vapor deposition for applying said high-frequency electric field is bias ECR (Electron Cyclotron Resonance)—CVD.

3. The semiconductor device according to claim 1, further comprising a second interlayer insulator film formed between said resistor layer and said first interlayer insulator film.

4. The semiconductor device according to claim 3, wherein said second interlayer insulator film is comprised of one or both of a silicon oxide film and a BPSG film, formed by atmospheric pressure chemical vapor deposition.

5. The semiconductor device according to claim 1, wherein said resistor layer is formed of non-doped polysilicon which is not doped with an impurity.

6. A semiconductor device, comprising:

a non-doped polysilicon resistor formed on a substrate and having hydrogen atomic concentration equal to or greater than $6\times10^{18}/cm^3$ so that resistance of said resistor is stabilized against diffusion of lower concentrations of incidental hydrogen atoms.

7. The semiconductor device according to claim 6, further comprising a first interlayer insulator film formed over said resistor layer, said first interlayer insulator film being comprised of a silicon oxide film formed by chemical vapor deposition which applies a high-frequency electric field to thereby provided said hydrogen atomic concentration of equal to or greater than $6\times10^{18}/cm^3$ to said resistor.

8. The semiconductor device according to claim 7, wherein said chemical vapor deposition for applying said high-frequency electric field is bias ECR (Electron Cyclotron Resonance)—CVD.

9. The semiconductor device according to claim 8, further comprising a second interlayer insulator film formed between said resistor layer and said first interlayer insulator film.

10. The semiconductor device according to claim 9, wherein said second interlayer insulator film is comprised of a silicon oxide film.

11. The semiconductor device according to claim 10, wherein said second interlayer insulator film is further comprised of a BPSG film.

12. The semiconductor device according to claim 11, wherein said resistor layer is doped with an impurity.

13. A semiconductor device, comprising:

a substrate;

a non-doped polysilicon resistor formed on a portion of an upper surface of said substrate;

a first silicon oxide film formed on said upper surface of said substrate and over an upper and side surfaces of said resistor;

a BPSG film formed on an entire upper surface of said first silicon dioxide film;

two metal wiring connections formed on an upper surface of said BPSG film and penetrating said BPSG film and said first silicon dioxide to connect to said resistor at different respective locations; and a second silicon oxide film formed by chemical vapor deposition which applies a high-frequency electric field so that hydrogen atomic concentration of said resistor is increased to be equal to or greater than $6\times10^{18}/cm^3$, thereby stabilizing resistance of said resistor against diffusion of lower concentrations of incidental hydrogen atoms.

14. The semiconductor device according to claim 13, wherein said resistor layer is doped with an impurity.

* * * * *